(12) United States Patent
Yamazaki

(10) Patent No.: US 11,243,587 B2
(45) Date of Patent: Feb. 8, 2022

(54) DATA PROCESSING DEVICE

(71) Applicant: SANKEN ELECTRIC CO., LTD., Niiza (JP)

(72) Inventor: Takanaga Yamazaki, Niiza (JP)

(73) Assignee: SANKEN ELECTRIC CO., LTD., Niiza (JP)

(*) Notice: Subject to any disclaimer, the term of this patent is extended or adjusted under 35 U.S.C. 154(b) by 315 days.

(21) Appl. No.: 16/453,196

(22) Filed: Jun. 26, 2019

(65) Prior Publication Data
US 2020/0004305 A1 Jan. 2, 2020

(30) Foreign Application Priority Data
Jun. 27, 2018 (JP) ............................. JP2018-122086

(51) Int. Cl.
G06F 1/24 (2006.01)
G06F 1/26 (2006.01)
H03K 17/22 (2006.01)
G06F 9/4401 (2018.01)
G06F 15/177 (2006.01)

(52) U.S. Cl.
CPC ................ G06F 1/24 (2013.01); G06F 1/26 (2013.01); G06F 9/4403 (2013.01); G06F 9/4405 (2013.01); G06F 15/177 (2013.01); H03K 17/22 (2013.01)

(58) Field of Classification Search
CPC ........ G06F 1/24; G06F 9/4405; G06F 9/4403; G06F 15/177; G06F 1/26; H03K 17/22
See application file for complete search history.

(56) References Cited

U.S. PATENT DOCUMENTS

| | | | |
|---|---|---|---|
| 2003/0163766 A1* | 8/2003 | Urahama | G06F 11/2284 714/36 |
| 2006/0261868 A1* | 11/2006 | Ju | H03L 7/00 327/143 |
| 2008/0012613 A1* | 1/2008 | Hotaka | H03K 3/356008 327/143 |
| 2010/0156479 A1* | 6/2010 | Matsubara | H03K 17/22 327/143 |
| 2014/0325322 A1* | 10/2014 | Kaeriyama | H04B 5/0081 714/819 |

FOREIGN PATENT DOCUMENTS

JP 2013-206149 A 10/2013

* cited by examiner

Primary Examiner — Chun Cao
(74) Attorney, Agent, or Firm — Metrolex IP Law Group, PLLC

(57) ABSTRACT

A data processing device according to one or more embodiment is disclosed. The data processing device may include a first power-on reset circuit that generates a first power-on reset signal depending on power source voltage, and a processor that activates based on a first power-on reset signal generated by the first power-on reset circuit and that runs software. The processor determines if the normal first power-on reset signal is used to cause the processor to activate and run the software.

4 Claims, 4 Drawing Sheets

| 2bit F/F | {s0,s1,s2,s3} | FUNCTION SELECTION |
|---|---|---|
| 0x | 000x | POR1 & POR2 (OR) OUTPUT |
| 10 | 0110 | POR1 OUTPUT, POR2 TEST |
| 11 | 1011 | POR1 TEST, POR2 OUTPUT |

DATA PROCESSING DEVICE

CROSS REFERENCE TO RELATED APPLICATIONS

This application claims priority based on 35 USC 119 from prior Japanese Patent Application No. 2018-122086 filed on Jun. 27, 2018, entitled "DATA PROCESSING DEVICE", the entire contents of which are incorporated herein by reference.

BACKGROUND

The disclosure relates to a data processing device which may be applied to an electronic control system meeting functional safety standards for automobiles.

In integrated circuits (ICs) and large-scale integrated circuits (LSIs) of microcomputers and the like including digital circuits, a reset signal is necessary immediately after power-on to initialize an output value of a flip-flop circuit in an internal circuit.

Many ICs and LSIs include a power-on reset (POR) circuit, which detects power source voltage and generates the reset signal.

When the power source voltage is lower than certain voltage, the power-on reset circuit asserts the reset signal and sets the inside of the IC or LSI to a reset state. When the power source voltage is higher than the certain voltage, the power-on reset circuit negates the reset signal and cancels the reset state.

A system described in Japanese Patent Application Publication No. 2013-206149 (Patent Literature 1) includes a semiconductor integrated circuit without a dedicated terminal (reset terminal) for resetting the circuit from the outside and Patent Literature 1 discloses a technique of resetting the semiconductor integrated circuit from the outside when a power-on reset circuit fails in the semiconductor integrated circuit. Specifically, the system includes a mechanism that can generate a reset signal for the internal circuit when receiving a certain bit pattern by using a terminal configured to receive clock synchronous serial communication from the outside.

SUMMARY

A data processing device according to one or more embodiments may include a first power-on reset circuit that generates a first power-on reset signal depending on power source voltage; and a processor that activates based on a first power-on reset signal generated by the first power-on reset circuit and that runs software, wherein the processor determines if the normal first power-on reset signal is used to cause the processor to activate and run the software.

DETAILED DESCRIPTION

Figure 1:
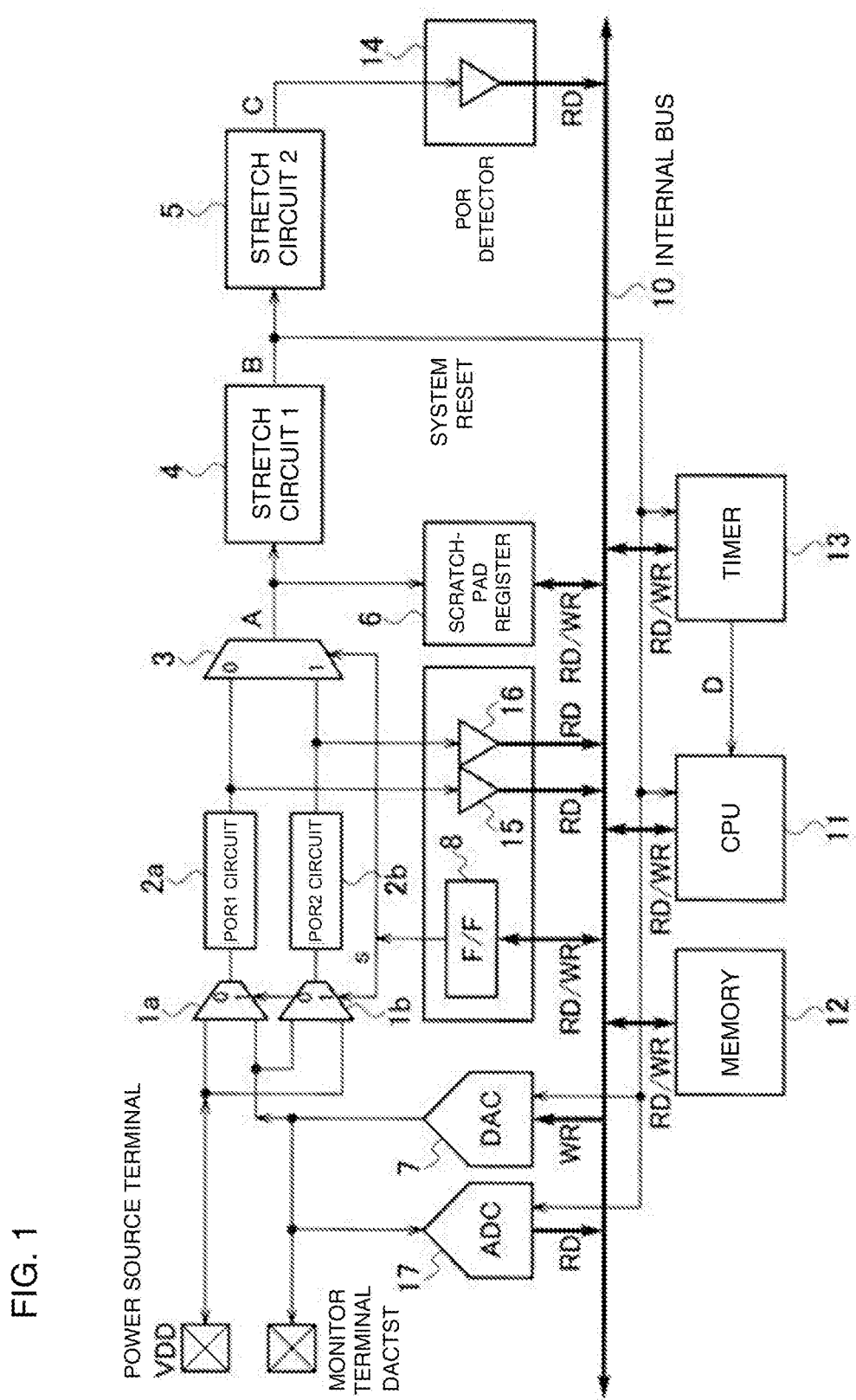
FIG. 1 is a configuration block diagram illustrating a data processing device including power-on reset circuits of the first example according to one or more embodiments.

One or more embodiments of data processing device are described with referring to drawings. In the respective drawings referenced herein, the same constituents are designated by the same reference numerals and duplicate explanation concerning the same constituents may be omitted. All of the drawings are provided to illustrate the respective examples only. No dimensional proportions in the drawings shall impose a restriction on the embodiments.

First Example

The data processing device is a data processing device which can be employed in an electronic control system meeting functional safety standards for automobiles. The data processing device includes multiplexers 1a, 1b, power-on reset circuits (POR circuits) 2a, 2b, a multiplexer 3, a first stretch circuit 4, a second stretch circuit 5, a scratchpad register 6, a digital/analog conversion circuit (DAC circuit) 7, a flip-flop circuit (FF) 8, a bus 10, a CPU 11, a memory 12, a timer 13, and a POR detector 14. Moreover, the data processing device includes a power source terminal VDD, a monitor terminal DACTST, a first output level determination circuit 15, a second output level determination circuit 16, and an analog/digital conversion circuit (ADC circuit) 17.

The scratchpad register 6, the digital/analog conversion circuit 7, the flip-flop circuit 8, the memory 12, the timer 13, the POR detector 14, the first output level determination circuit 15, the second output level determination circuit 16, and the analog/digital conversion circuit 17 are connected to the bus 10 and the CPU 11 can access them (read and/or write data therefrom and/or thereto).

Next, operations of the data processing device of the first example according to one or more embodiments configured as described above are described in detail with reference to the drawings.

Description is given of a configuration and operations of testing the power-on reset circuits illustrated in FIG. 1 in runtime (in operation). The flip-flop circuit 8 may correspond to an embodiment of a selector and outputs an output of "0" or "1" to the multiplexers 1a, 1b and the multiplexer 3 as a selection signal. The flip-flop circuit 8 is configured such that reception of a reset signal is unnecessary and an initial value of the selection signal at power on is either "0" or "1."

The multiplexer 1a is an analog multiplexer. When receiving the selection signal of "0" from the flip-flop circuit 8, the multiplexer 1a selects voltage of the power source terminal VDD which is one of the voltage of the power source terminal VDD and voltage of the monitor terminal DACTST and outputs it to the power-on reset circuit 2a.

The multiplexer 1b is an analog multiplexer. When receiving the selection signal of "0" from the flip-flop circuit 8, the multiplexer 1b selects the voltage of the monitor terminal DACTST which is the other one of the voltage of the power source terminal VDD and the voltage of the monitor terminal DACTST and outputs it to the power-on reset circuit 2b.

When receiving the selection signal of "1" from the flip-flop circuit 8, the multiplexer 1a selects the voltage of the monitor terminal DACTST and outputs it to the power-on reset circuit 2a.

When receiving the selection signal of "1" from the flip-flop circuit 8, the multiplexer 1b selects the voltage of the power source terminal VDD and outputs it to the power-on reset circuit 2b.

The power-on reset circuit 2a may correspond to a first power-on reset circuit. When the selection signal of "0" is received from the flip-flop circuit 8, the power-on reset circuit 2a generates a first power-on reset signal depending on the voltage of the power source terminal VDD. Specifically, the power-on reset circuit 2a functions as a reset circuit of the data processing device.

When the selection signal of "1" is received from the flip-flop circuit 8, the power-on reset circuit 2a generates the first power-on reset signal depending on the voltage of the monitor terminal DACTST. Specifically, the power-on reset circuit 2a is set as a target whose functions and characteristics are to be tested.

The power-on reset circuit 2b may correspond to a second power-on reset circuit. When the selection signal of "0" is received from the flip-flop circuit 8, the power-on reset circuit 2b generates a second power-on reset signal depending on the voltage of the monitor terminal DACTST. Specifically, the power-on reset circuit 2b is set as a target whose functions and characteristics are to be tested.

When the selection signal of "1" is received from the flip-flop circuit 8, the power-on reset circuit 2b generates the second power-on reset signal depending on the power source voltage, that is the voltage of the power source terminal VDD. Specifically, the power-on reset circuit 2b functions as the reset circuit of the data processing device.

The first power-on reset signal of the power-on reset circuit 2a and the second power-on reset signal of the power-on reset circuit 2b are outputted to the bus 10 via the first output level determination circuit 15 and the second output level determination circuit 16, respectively. The CPU 11 can read the first and second power-on reset signals via the bus 10. In the aforementioned configuration, the power-on reset circuits can be tested in operation.

Figure 2:
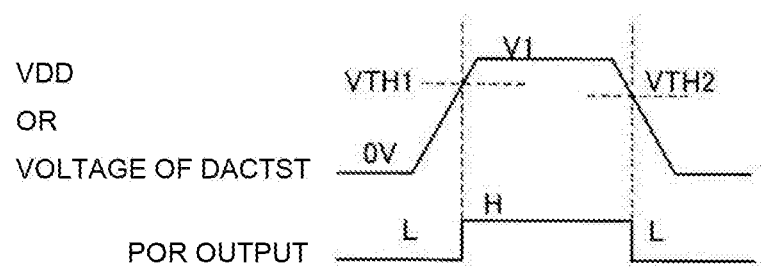
FIG. 2 is a waveform diagram illustrating a relationship between control voltage and a reset signal in the data processing device of the first example according to one or more embodiments.

As illustrated in FIG. 2, the power-on reset circuit 2a and the power-on reset circuit 2b each change the level of the output signal (first power-on reset signal) depending on the level of the power source voltage. When the power source voltage is lower than first voltage VTH1, the output signal is in a LOW level. When the power source voltage is higher than the first voltage VTH1, the output signal is in a HIGH level. In this case, for example, second voltage VTH2 lower than the first voltage VTH1 may be provided such that the power-on reset circuits are provided with a hysteresis characteristic.

Output voltage of the DAC circuit 7 controlled by the CPU 11 is supplied to the power-on reset circuit selected by the flip-flop circuit 8 as the circuit whose functions and characteristics are to be tested. The output voltage of the digital/analog conversion circuit 7 is voltage emulating a change in the power source voltage. At the same time, the CPU 11 can detect the level of the reset signal outputted from this power-on reset circuit via the bus 10 and the first output level determination circuit 15 or the second output level determination circuit 16 and test whether the characteristics illustrated in FIG. 2 can be obtained. During this test, since the power-on reset circuit functioning as the reset circuit of the data processing device is monitoring the voltage level of the power source terminal VDD, this power-on reset circuit can output the power-on reset signal anytime depending on the state of the power source voltage.

The CPU 11 determines that the power-on reset circuit, which is not selected, or in other words is selected as the circuit whose functions and characteristics are to be tested as described above generates a normal power-on reset signal. Specifically, the CPU 11 can determine that the power-on reset circuit 2b is normal. Accordingly, the electronic control system can meet the functional safety standards.

Next, the CPU 11 inverts the level of the flip-flop circuit 8 and interchanges the roles of the two power-on reset circuits. Then, the CPU 11 can test the power-on reset circuit functioning as the circuit whose functions and characteristics are to be tested as described above. During this test, the power-on reset circuit functioning as the reset circuit maintains its functions.

Note that the voltage generated by the digital/analog conversion circuit 7 may be inputted into the CPU 11 via the analog/digital conversion circuit 17. The CPU 11 can inspect whether the voltage generated by the digital/analog conversion circuit 7 is correct in runtime. Moreover, the voltage generated by the digital/analog conversion circuit 7 may be outputted from the monitor terminal DACTST to the outside. In this case, whether the digital/analog conversion circuit 7 and the analog/digital conversion circuit 17 are normal can be inspected by using an external device. This inspection is generally performed in delivery inspection after the manufacturing of the data processing device.

Next, description is given of a configuration and operations of determining whether the normal first power-on reset signal is used to cause a processor to activate and run software.

When receiving the selection signal of "0" from the flip-flop circuit 8, the multiplexer 3 outputs the first power-on reset signal of the power-on reset circuit 2a to the first stretch circuit 4 and the scratchpad register 6 as an internal signal A. When receiving the selection signal of "1" from the flip-flop circuit 8, the multiplexer 3 outputs the second power-on reset signal of the power-on reset circuit 2b to the first stretch circuit 4 and the scratchpad register 6 as the internal signal A.

Figure 3:
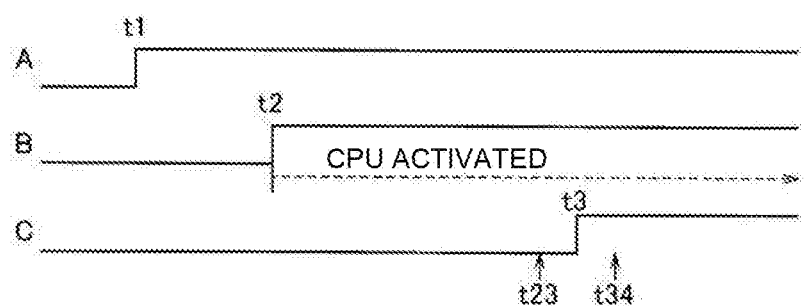
FIG. 3 is a waveform diagram illustrating operations of portions in the data processing device of the first example according to one or more embodiments.
Figure 4:
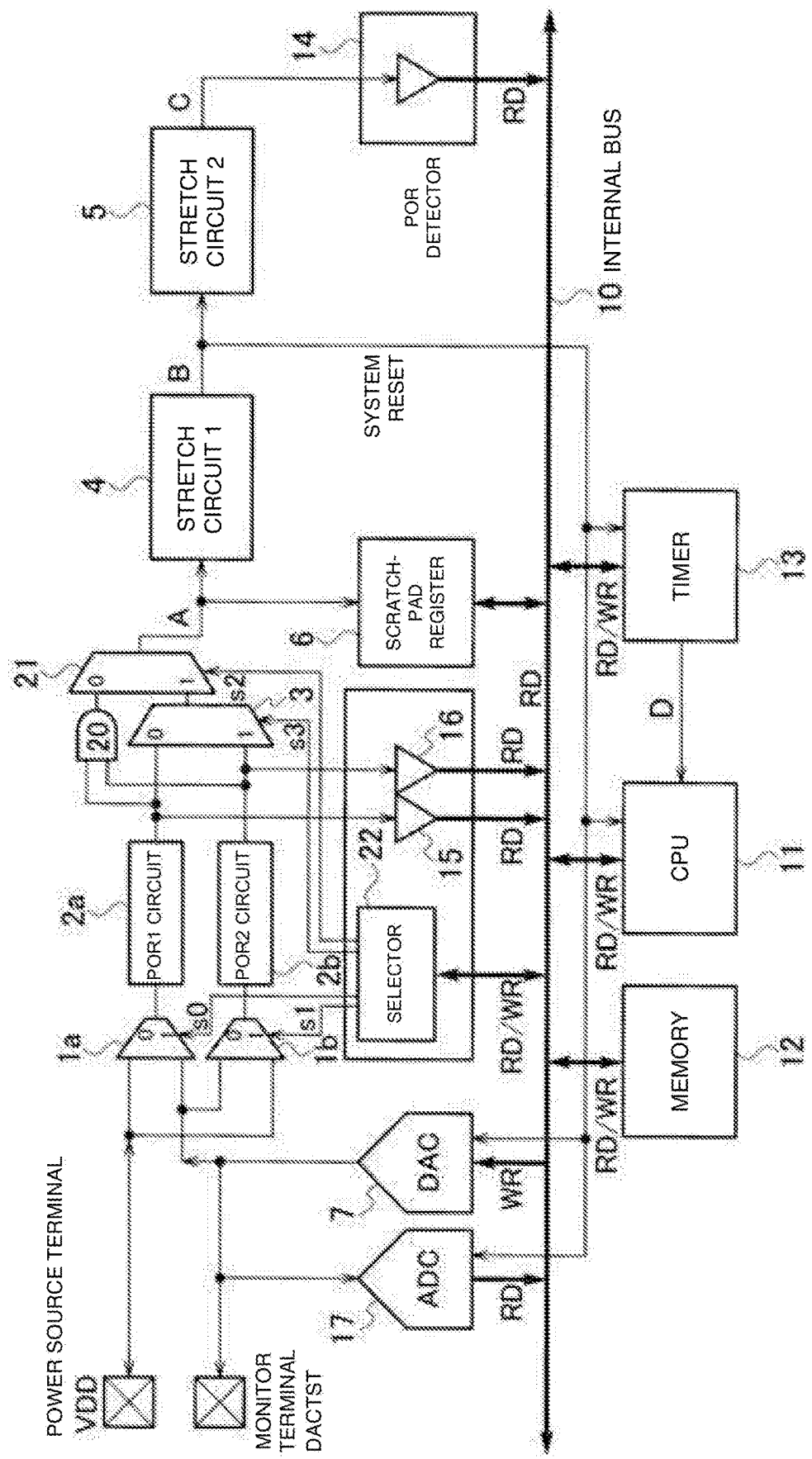
FIG. 4 is a configuration block diagram illustrating a data processing device including power-on reset circuits of the second example according to one or more embodiments.

As illustrated in FIG. 3, the first stretch circuit 4 generates an internal signal B and outputs it to the second stretch circuit 5, the internal signal B obtained by extending an assertion period (low level period) of the internal signal A based on the power-on reset signal from the power-on reset circuit 2a or the power-on reset circuit 2b by first predetermined time (time between time point t1 and time point t2). Moreover, the internal signal B resets system internal logic circuits such as the digital/analog conversion circuit 7, the CPU 11, the memory 12, the timer 13, and the analog/digital conversion circuit 17.

The CPU 11 may correspond to a processor. Negating the internal signal B (setting the internal signal B to High level) cancels a reset state of the CPU 11 and the CPU 11 activates to run software.

The second stretch circuit 5 further extends the assertion period of the internal signal B, which has been extended in the first stretch circuit 4, by second predetermined time (time between time point t2 and time point t3) and outputs the internal signal with the extended assertion period to the bus 10 via the POR detector 14 as an internal signal C.

The POR detector 14 detects the level of the internal signal C and outputs it to the bus 10 when the CPU 11 executes a power-on reset determination program stored in the memory 12. In this example, as illustrated in FIG. 3, a time point at which the internal signal B is negated, that is the time point of the activation of the CPU 11 is referred to as t2 and a time point at which the internal signal C is negated is referred to as t3. Moreover, a time point just before the time point t3 is referred to as t23 and a time point just after the time point t3 is referred to as t34.

When the CPU 11 activates at the time point t2, the CPU 11 causes the timer 13 to output an internal signal D to the CPU 11 at the time point t23. The CPU 11 detects the level of the internal signal C via the POR detector 14 with the internal signal D being a trigger of the detection. Next, the CPU 11 causes the timer 13 to output the internal signal D to the CPU 11 at the time point t34. The CPU 11 detects the level of the internal signal C via the POR detector 14 with the internal signal D being a trigger of the detection. When the level of the internal signal C is the Low level at the time point t23 and is the High level at the time point t34, the CPU 11 determines that the software has activated based on normal power-on reset. When this condition is not satisfied, the CPU 11 determines that the program has activated without the power-on reset being performed and can assume that abnormality or failure has occurred in the system.

Note that, if the power-on reset signal outputted by the power-on reset circuit 2a or the power-on reset circuit 2b has an enough time width to surely reset the data processing device, the first stretch circuit 4 may be omitted.

The scratchpad register 6 may correspond to a register and may be configured to be initialized by the internal signal. After the activation of the CPU 11, the CPU 11 rewrites a value of the scratchpad register 6 into a value other than the initial value. When the power-on reset circuit 2a or the power-on reset circuit 2b outputs a pulse signal which cannot be detected by the stretch circuits downstream thereof due to an erroneous operation during the normal operation, the value of the scratchpad register 6 is initialized. Accordingly, the CPU 11 can detect erroneous operations such as the power-on reset circuit outputting an unintentional narrow reset pulse, based on the value of the scratchpad register 6.

As described above, according to the data processing device of the first example according to one or more embodiments, when the initial signal B is used to cause the CPU 11 to activate and run the software, the CPU 11 determines whether the normal first power-on reset signal is used to cause the CPU 11 to activate and run the software.

Specifically, since the CPU 11 can determine whether the normal first power-on reset signal is used to cause the CPU 11 to activate and cause the software to activate, the electronic control system can meet the functional safety standards.

Second Example

A data processing device of the second example according to one or more embodiments is different from the data processing device of the first example according to one or more embodiments in that the data processing device of the second example according to one or more embodiments includes a logic gate 20 and a multiplexer 21 and a multibit selector 22 is provided instead of the one-bit flip-flop circuit 8.

The logic gate 20 is configured to take a logical or of outputs of the power-on reset circuits 2a, 2b and output the logical or to the multiplexer 21.

The multiplexer 21 is configured to select the output signal of the logic gate 20 when a selection signal s2 is 0 and select the output of the multiplexer 3 when the selection signal s2 is 1.

Figures 5, 6:
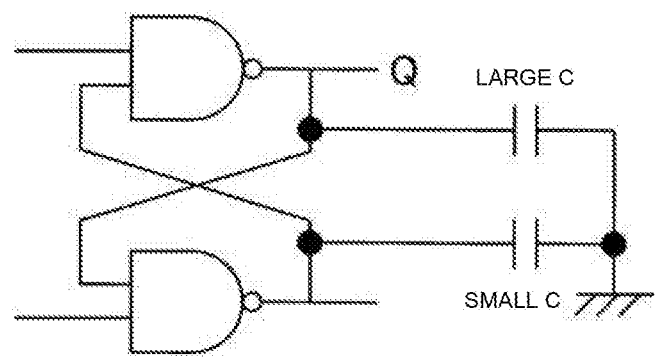
FIG. 5 is a diagram illustrating an example of a flip-flop circuit configuration of the second example according to one or more embodiments.
FIG. 6 is a diagram illustrating a truth table of a decoder circuit of the second example according to one or more embodiments.

The selector 22 includes a flip-flop circuit and a decoder circuit. The flip-flop circuit has, for example, a two-bit configuration and has such a physical structure that at least a higher bit out of the two bits is initialized to 0 when the power is turned on. The flip-flop circuit is configured to disturb balance of output load as illustrated in, for example, FIG. 5. A truth table of the decoder circuit has the contents as illustrated in FIG. 6. The selector 22 outputs multiple selection signals s0 to s3 of the decoder circuit to the multiplexers 1a, 1b, 3, 21, respectively.

When the two-bit level of the flip-flop circuit is 0x in binary number in the case where power is applied to the data processing device of the second example according to one or more embodiments, the output of the decoder circuit is 000x. In this case, the output of the logic gate 20 is used to reset the system. When the CPU 11 rewrites a value of the flip-flop circuit to 10 in binary number, the power-on reset circuit 2a is used in the power-on reset function which monitors the power source voltage and the power-on reset circuit 2b is used as the target whose functions and characteristics are to be tested. Moreover, when the CPU 11 rewrites the value of the flip-flop circuit to 11 in binary number, the power-on reset circuit 2a is used as the target whose functions and characteristics are to be tested and the power-on reset circuit 2b is used in the power-on reset function which monitors the power source voltage.

In the data processing device of second example according to one or more embodiments, the same effects as those in the first example can be obtained and the logical or of the outputs of the multiple power-on reset circuits 2a, 2b is set as the power-on reset signal. Specifically, since the electronic control system can be reset even if one of the power-on reset circuits fails, the electronic control system can meet the functional safety standards. Moreover, the test of the functions and characteristics of the power-on reset circuits is performed as in the first example.

Generally, when a power-on reset circuit breaks down over time, an inside of an IC or an LSI cannot be normally initialized and this may lead to operation abnormality. In order to achieve functional safety for the power-on reset circuit, it is preferable that a device can determine whether a logic circuit is normally reset and made to activate after power on and determine whether the power-on reset circuit is normal.

However, in the system described in Patent Literature 1, when the logic circuit appears to normally activate despite failure of the power-on reset circuit, it is impossible to determine whether the activation is normal or abnormal. Moreover, the conventional system cannot determine the details of the failure of the power-on reset circuit.

According to the data processing device according to one or more embodiments, when the first power-on reset signal is used to cause the processor to activate and run the software, the processor determines whether the normal first power-on reset signal is used to cause the processor to activate and run the software.

Specifically, since the processor can determine whether the normal first power-on reset signal is used to cause the processor to activate and run the software, the data processing device more adequate for the functional safety standards is provided.

The invention may include other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A data processing device comprising:
   a first power-on reset circuit that generates a first power-on reset signal depending on power source voltage;
   a first stretch circuit that extends the first power-on reset signal from the first power-on reset circuit by first predetermined time;
   a second stretch circuit that extends the first power-on reset signal extended by the first stretch circuit by second predetermined time; and
   a processor that activates based on the first power-on reset signal generated by the first power-on reset circuit and that runs software, wherein
   the processor determines if a normal operation of the first power-on reset signal is used to cause the processor to activate and run the software,
   the processor activates upon cancellation of the first power-on reset signal extended by the first stretch circuit,
   in response to a change of an internal signal extended by the first stretch circuit, the processor determines that the normal operation of the first power-on reset signal is used to cause the processor to activate and run the software, and
   in response to a change of an internal signal extended by the second stretch circuit, the processor determines that the normal operation of the first power-on reset signal is used to cause the processor to activate and run the software.

2. The data processing device according to claim 1, further comprising a register that is initialized by the first power-on reset signal from the first power-on reset circuit, wherein
   the processor rewrites a value of the register to a value other than an initial value after activation and detects an erroneous operation of the first power-on reset circuit based on the value of the register.

3. A data processing device comprising:
   a first power-on reset circuit that generates a first power-on reset signal depending on power source voltage;
   a second power-on reset circuit that generates a second power-on reset signal;
   a processor that activates based on the first power-on reset signal generated by the first power-on reset circuit and that runs software;
   a digital/analog conversion circuit that outputs voltage emulating a change in power source voltage; and
   a selector that selects the first power-on reset circuit or the second power-on reset circuit depending on flag information, inputs one of an output of the digital/analog conversion circuit and the power source voltage into the selected power-on reset circuit, and inputs the other one of the output of the digital/analog conversion circuit and the power source voltage to not-selected power-on reset circuit, wherein
   the processor determines whether the not-selected power-on reset circuit is normal based on an output of the not-selected power-on reset circuit and the output of the digital/analog conversion circuit.

4. The data processing device according to claim 3, further comprising a logic gate that takes and outputs a logical or of outputs of the first power-on reset circuit and the second power-on reset circuit, wherein
   the processor activates based on the logical or.

* * * * *